(12) United States Patent
Liang et al.

(10) Patent No.: US 7,173,822 B2
(45) Date of Patent: Feb. 6, 2007

(54) TECHNIQUES FOR PROVIDING VENTILATION AND EMI SHIELDING TO ELECTRONIC CIRCUITRY USING A PANEL MEMBER WITH BRIMMED HOLES

(75) Inventors: Hsing-Sheng Liang, San Jose, CA (US); Sridevi Iyengar, San Jose, CA (US); Phillip Ting, San Jose, CA (US); Saeed Seyed, Los Altos Hills, CA (US); Jim Chiappe, Walnut Creek, CA (US)

(73) Assignee: Cisco Technology, Inc., San Jose, CA (US)

( * ) Notice: Subject to any disclaimer, the term of this patent is extended or adjusted under 35 U.S.C. 154(b) by 9 days.

(21) Appl. No.: 10/975,179

(22) Filed: Oct. 28, 2004

(65) Prior Publication Data
US 2006/0092608 A1  May 4, 2006

(51) Int. Cl.
*H05K 7/20* (2006.01)

(52) U.S. Cl. ............... 361/695; 361/690; 361/719; 361/818; 454/184

(58) Field of Classification Search ............ 361/687, 361/690, 692–695, 816, 818; 174/35 R, 174/50, 35 MS, 35 GC; 454/184; 210/335, 210/337
See application file for complete search history.

(56) References Cited

U.S. PATENT DOCUMENTS

| | | | |
|---|---|---|---|
| 5,285,350 A * | 2/1994 | Villaume ............ | 361/690 |
| 5,928,076 A * | 7/1999 | Clements et al. ....... | 454/184 |
| 6,252,161 B1 * | 6/2001 | Hailey et al. .......... | 174/35 R |
| 6,297,446 B1 * | 10/2001 | Cherniski et al. ....... | 174/35 R |
| 6,426,459 B1 * | 7/2002 | Mitchell ............ | 174/35 MS |
| 6,430,052 B1 | 8/2002 | Kordes et al. .......... | 361/719 |
| 6,567,276 B2 * | 5/2003 | Kopf et al. ............ | 361/818 |
| 6,671,186 B2 * | 12/2003 | Kopf ................. | 361/818 |
| 6,714,416 B1 | 3/2004 | McLeod et al. ......... | 361/719 |
| 6,728,104 B1 | 4/2004 | Ahmad et al. .......... | 361/704 |
| 6,826,057 B1 | 11/2004 | Gundogan et al. ....... | 361/726 |
| 6,870,092 B2 * | 3/2005 | Lambert et al. ........ | 174/35 GC |
| 6,914,780 B1 | 7/2005 | Shanker et al. ........ | 361/687 |
| 6,947,294 B2 * | 9/2005 | Lin et al. ............ | 361/818 |
| 6,987,673 B1 | 1/2006 | French et al. .......... | 361/727 |
| 2005/0152106 A1 * | 7/2005 | Coster et al. .......... | 361/683 |
| 2006/0103013 A1 | 5/2006 | Huynh et al. .......... | 257/712 |

* cited by examiner

*Primary Examiner*—Michael Datskovskiy
(74) *Attorney, Agent, or Firm*—BainwoodHuang (57) ABSTRACT

A panel member attaches to a frame that supports electronic circuitry. The panel member includes a mounting portion configured to mount to the frame, and a face portion coupled to the mounting portion. The face portion defines a plane and multiple openings within the plane. The panel member further includes multiple brimmed portions coupled to the face portion. Each brimmed portion (i) extends around an opening defined by the face portion and (ii) projects from that opening in a direction which is away from the plane. The use of such a panel member provides improved airflow and stagnation pressure as well as robust electromagnetic interference protection.

10 Claims, 8 Drawing Sheets

TECHNIQUES FOR PROVIDING VENTILATION AND EMI SHIELDING TO ELECTRONIC CIRCUITRY USING A PANEL MEMBER WITH BRIMMED HOLES

BACKGROUND

Conventional enclosures for electronic circuitry take a variety of forms. One conventional enclosure includes a chassis, an inlet air vent and an exhaust air vent. Here, the vents are part of the chassis which defines an interior space, and electronic components such as a power supply, a fan assembly and electronic circuitry, reside within that interior space.

During operation, the power supply provides power to both the fan assembly and the electronic circuitry. As the electronic circuitry performs various electronic operations, the fan assembly moves air from an outside ambient location adjacent the inlet air vent, across the electronic circuitry, and discharges that air to an outside ambient location through the exhaust air vent. As the stream of air passes across the electronic circuitry, the air stream carries away heat thus enabling the electronic circuitry to operate within a controlled and well-suited operating temperature range.

Some inlet and exhaust air vents are configured to concurrently operate as both a passageway for air, as well as a shield against electromagnetic interference (EMI). For example, some manufacturers cut circular or hexagonal shaped holes into standard sheet metal stock to produce a substantially flat metal vent having holes which are large enough to allow air to pass therethrough, but small enough to substantially block the passage of high frequency electromagnetic radiation. The sides of the holes are typically straight (i.e., orthogonal to the plane of the vent) due to the manner in which the manufacturer cuts the holes (e.g., by drilling or stamping the sheet metal stock), and the depth of the holes is generally the same as the thickness of the standard sheet metal stock.

SUMMARY

Unfortunately, there are deficiencies with the above-described conventional input and output vents formed by simply drilling or stamping straight-sided holes within sheet metal stock such that the depth of the holes is the same as the thickness of the sheet metal stock. For example, the thermal and EMI effects provided by such vents have been found to be less than inadequate particularly in view of the trend towards faster and higher power circuitry over time. Along these lines, it should be appreciated that the demands for thermal control and for EMI control are contradictory. That is, if the holes are too narrow, there is inadequate airflow through the vents. However, if the holes are too wide, there is inadequate EMI shielding provided by the vents. These competing demands have made designing an optimal geometry for the holes extremely difficult.

In contrast to the above-described conventional enclosure which uses vents formed by simply drilling or stamping straight-sided holes within sheet metal stock such that the depth of the holes is the same as the thickness of the sheet metal stock, embodiments of the invention are directed to techniques for venting electronic circuitry using panel members having brimmed holes, i.e., edges projecting around the holes and in a direction which is away from a plane of the panel member. The use of panel members having such brimmed holes enables production of contraction effects resulting in improved fluid flow performance (e.g., enhanced airflow and reduced pressure loss), with maintained or improved EMI shielding. Experimental results have shown that the use of panel members with such brimmed holes is capable of providing significant enhancements in airflow (e.g., a 24% increase) and significant reduction in pressure loss (e.g., a 10% reduction) for robust and reliable thermal control concurrently with robust EMI shielding results.

One embodiment of the invention is directed to a panel member for attaching to a frame that supports electronic circuitry. The panel member includes a mounting portion configured to mount to the frame, and a face portion coupled to the mounting portion. The face portion defines a plane and multiple openings within the plane. The panel member further includes multiple brimmed portions coupled to the face portion. Each brimmed portion (i) extends around an opening defined by the face portion and (ii) projects from that opening in a direction which is away from the plane (e.g., to provide a conical-shaped air passageway). The use of such a panel member provides improved airflow and stagnation pressure as well as robust EMI protection.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for venting electronic circuitry using panel members having brimmed holes, i.e., edges which project around the holes and in a direction which is away from a plane of the panel member. The use of panel members having such brimmed holes enables production of contraction effects resulting in improved fluid dynamics efficiency, with maintained or improved electromagnetic interference (EMI) shielding. Experimental results have shown that the use of panel members with such brimmed holes is capable of providing significant enhancements in airflow (e.g., a 24% increase) and significant reduction in pressure loss (e.g., a 10% reduction) for robust and reliable thermal control simultaneously with robust EMI shielding results.

Figure 1:
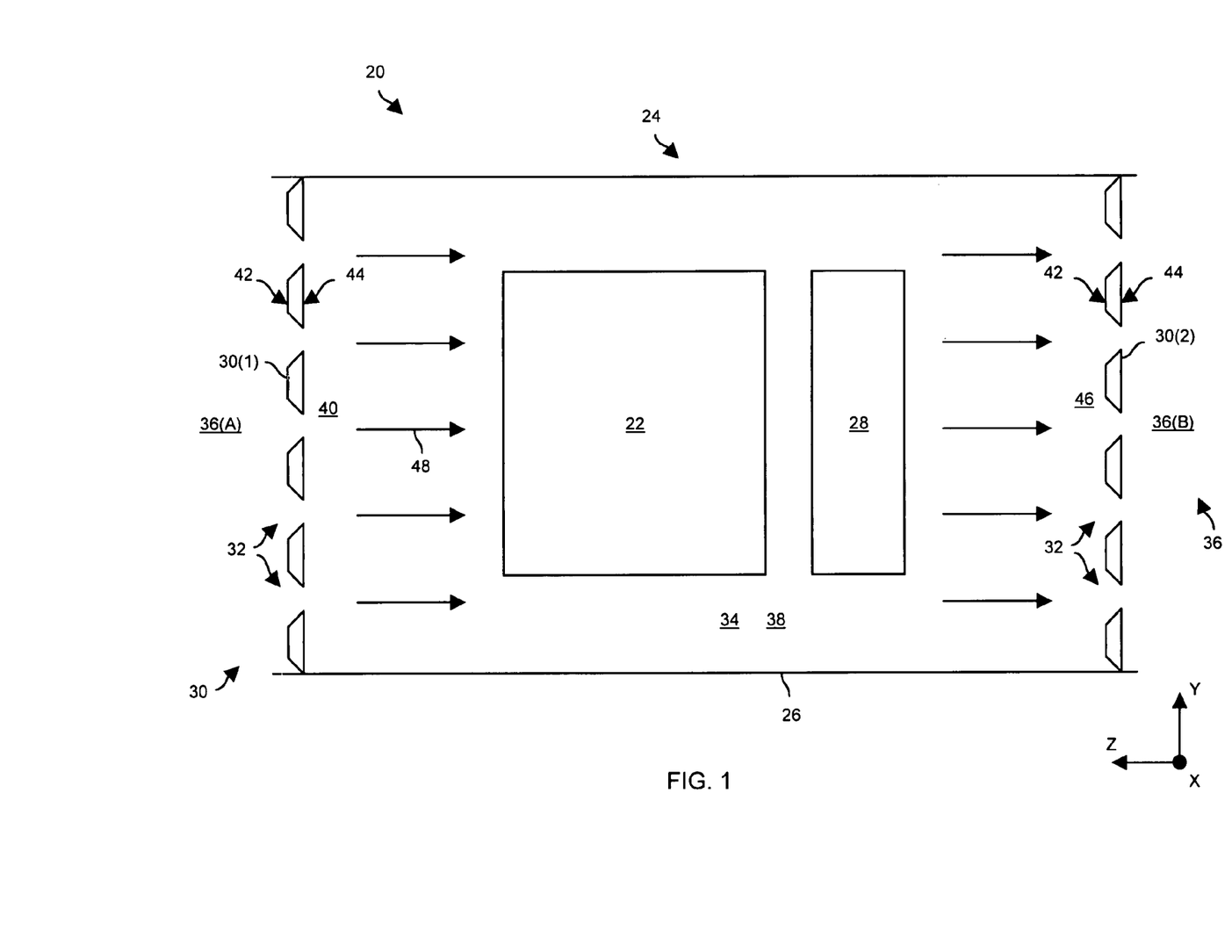
FIG. 1 is a cross-sectional side view of an electronic system which is suitable for use by the invention.

FIG. 1 shows an electronic system 20 which is suitable for use by the invention. The electronic system 20 includes electronic circuitry 22 and a support assembly 24. The electronic circuitry 22 is configured to perform a variety of electronic operations (e.g., data communications operations, server operations, computer processing operations, data storage operations, etc.). The support assembly 24 is configured to house and accommodate the electronic circuitry 22.

As shown, the support assembly 24 includes a frame 26, a fan subsystem 28, a first panel member 30(1) and a second panel member 30(2) (collectively, panel members 30). Each panel member 30 is planar in shape and extends along an X-Y plane. Additionally, the panel members 30 define holes 32 to enable air exchange between (i) an internal space 34 within the support assembly 24, and (ii) spaces 36 external to the support assembly 24. The holes 32 can be various styles such as the brimmed holes 32 in FIG. 2, and the brimmed holes 32 in FIGS. 3B, 3C, and FIG. 4.

The frame 26 holds the electronic circuitry 22 and the fan subsystem 28 at an enclosed location 38 of the frame 26 within the internal space 34. Additionally, the frame 26 holds the panel member 30(1) at an input or inlet location 40 with one face 42 of the panel member 30(1) facing an external space 36(A), and another face 44 facing the internal space 34. Similarly, the frame 26 holds the panel member 30(2) at an output or outlet location 46 with one face 42 of the panel member 30(1) facing the internal space 34, and another face 44 facing an external space 36(B).

During operation, the fan subsystem 28 is configured to generate an air stream 48 (see the arrows 48 in the negative Z-direction in FIG. 1) to cool the electronic circuitry 22 and thus enable the electronic circuitry 22 to operate within a controlled temperature range. In particular, the fan subsystem 28 moves air from the external space 36(A), through the holes 32 of the panel member 30(1), through the location 38 of the internal space 34 where the electronic circuitry 22 is disposed. The fan subsystem 28 continues to move the air from this central location 38, through the holes 32 of the panel member 30(2), and out to the external space 36(B). Accordingly, the fan subsystem 28 is capable of taking in cooler air from the external space 36(A) adjacent to the intake or input panel member 30(1), passing that air over the electronic circuitry 22 to remove heat from the electronic circuitry 22 using convection, and pushing that air out to the external space 36(B) adjacent to the exhaust panel member 30(2). In one arrangement, the external spaces 36(A), 36(B) are on opposite sides of the support assembly 24 to prevent the fan subsystem 28 from substantially drawing heated exhaust air back into the electronic system 20 through the intake panel member 30(1). Further details of the invention will now be provided with reference to FIG. 2.

Figure 2:
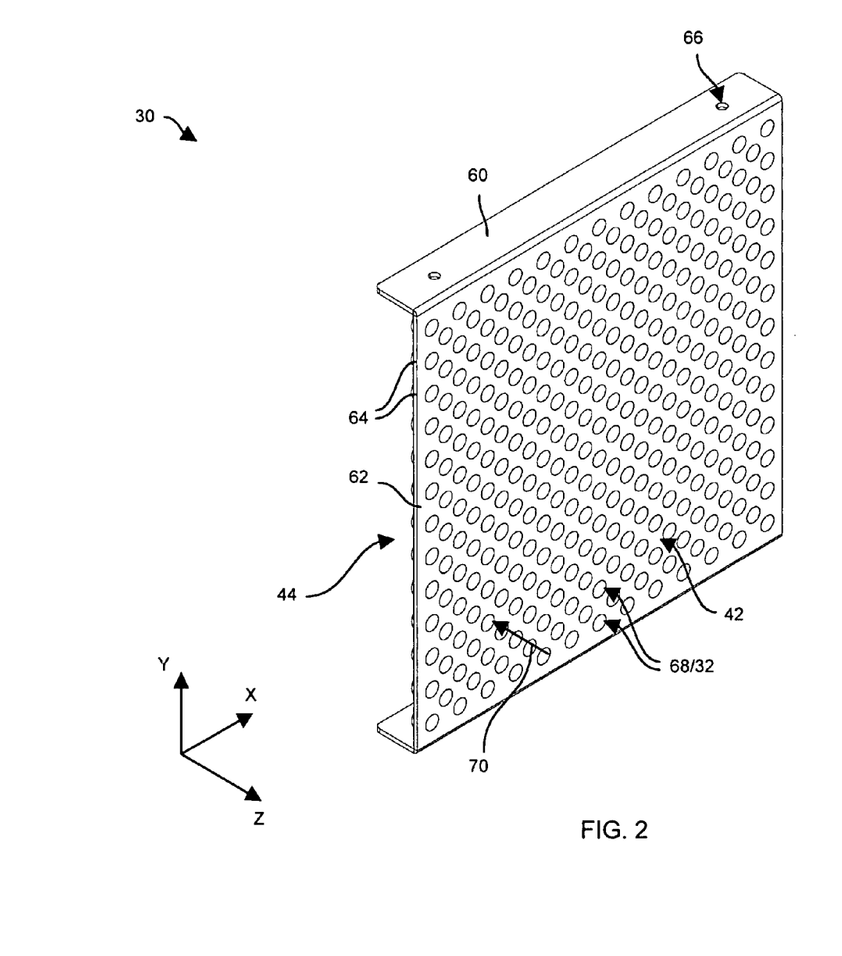
FIG. 2 is a perspective view of a panel member of the electronic system of FIG. 1.

FIG. 2 shows a perspective view of a panel member 30 of the electronic system 20. The panel member 30 includes a mounting portion 60, a face portion 62 and multiple brimmed portions 64. The mounting portion 60 is configured to mount to the frame 26 of the support assembly 24 (also see FIG. 1). By way of example, the mounting portion 60 defines screw holes 66 in order to attach to the frame 26 using hardware (e.g., bolts/screws and nuts). In alternative arrangements, the mounting portion 60 defines other types of mounting structures such as mounting grooves, tabs, detents, pins/posts, etc. In some arrangements, the mounting portion 60 is simply part of, or an extension of, the face portion 62 of the panel member 30.

The face portion 62 couples to the mounting portion 60, and defines the faces 42, 44 (also see FIG. 1). In particular, the face portion 62 defines an X-Y plane, and multiple openings 68 within the X-Y plane. The brimmed portions 64 couple to the face portion 62 and encircle the openings 68. In particular, each brimmed portion 64 extends around an adjacent opening 68, and projects away from the X-Y plane, e.g., in the negative Z-direction defined by the face portion 62 to form a brimmed hole 32 through which air is allowed pass, e.g., see the arrow 70 in FIG. 2.

In some arrangements, the mounting portion 60, the face portion 62 and the multiple brimmed portions 64 are integrated together to form a single, contiguous component. In some arrangements, the portions 60, 62, 64 include solid metal (e.g., electro-galvanized steel). In other arrangements, the portions 60, 62, 64 include a combination of metallic material and non-metallic material (e.g., a non-metallic core and a metallic coating). Further details of the invention will now be provided with reference to FIGS. 3A, 3B and 3C.

Figure 3A:
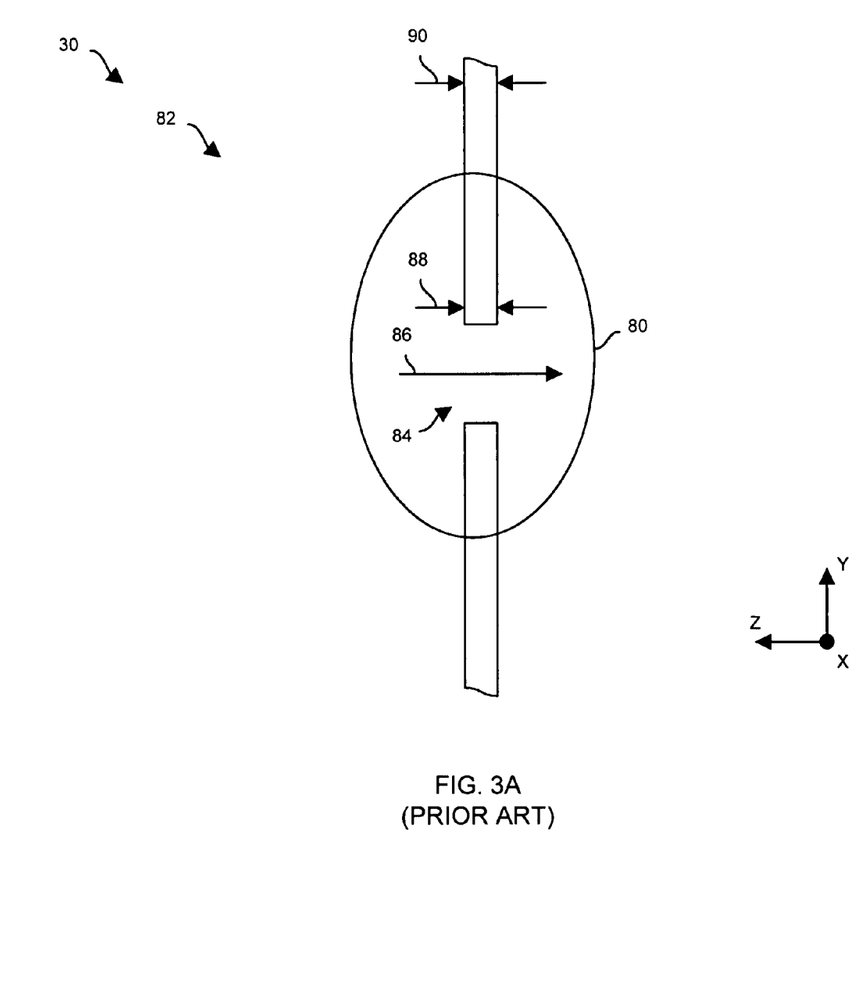
FIG. 3A is a cross-sectional side view of a portion of a conventional vent having a straight-sided hole formed by drilling or stamping standard sheet metal stock.

FIG. 3A is a cross-sectional side view of a portion 80 of a conventional vent 82 for an electronic enclosure. The conventional vent 82 extends in the X-Y plane, and includes multiple portions similar to the portion 80 which are distributed along the X-Y plane.

As shown, the portion 80 defines a straight-sided hole 84 that allows air to move therethrough and along the Z-axis, e.g., see the arrow 86 in the negative Z-direction. To form the straight-sided hole 84, a manufacturer cuts into standard sheet metal stock (e.g., by drilling or pressing). Accordingly, the depth 88 of the hole 84 as measured along the Z-axis and the depth 90 of the vent 82 as also measured along the Z-axis are the same.

Figure 3B:
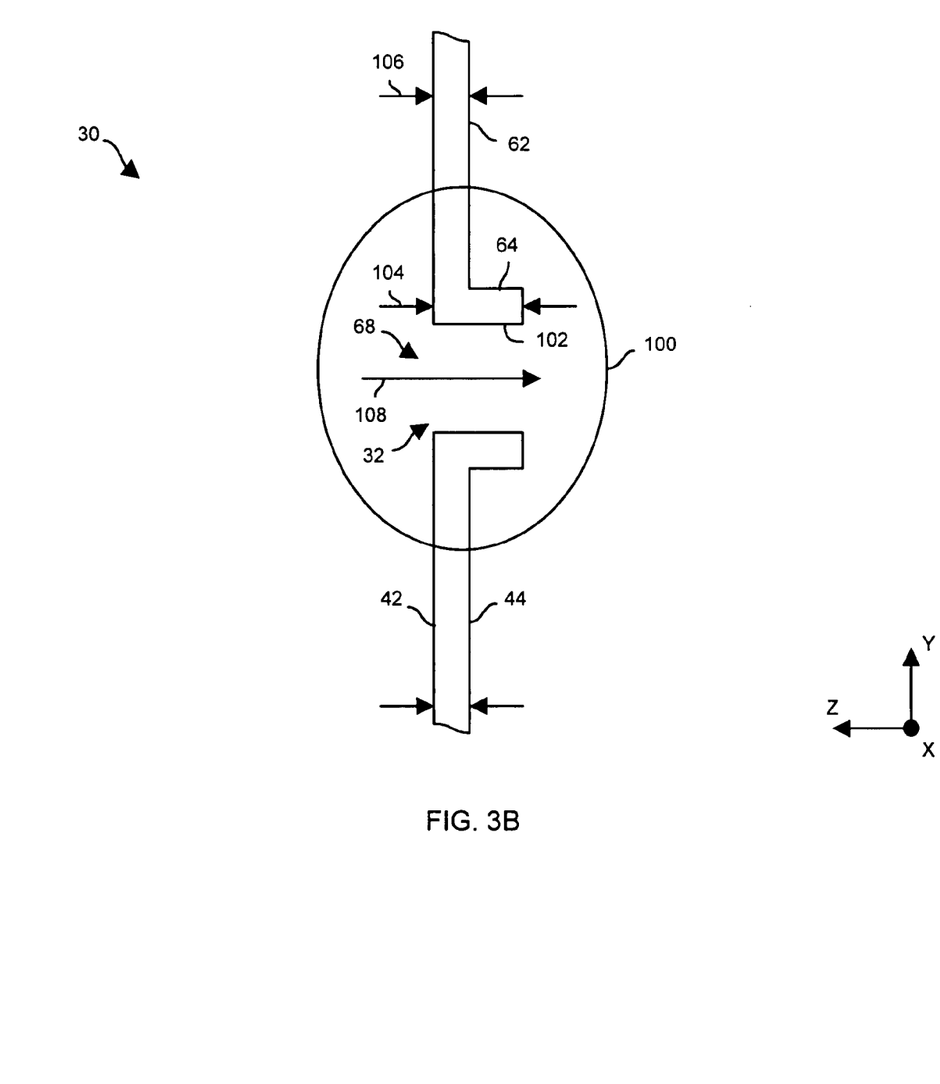
FIG. 3B is a cross-sectional side view of a portion of the panel member of FIG. 2 when the portion has a brimmed hole with a zero-degree flare.

FIG. 3B is a cross-sectional side view of a panel member portion 100 which is suitable for use as part of a panel member 30 of the electronic system 20 (also see FIGS. 1 and 2). Here, in a manner similar to the conventional vent 82 of FIG. 3A, the panel member 30 extends in the X-Y plane (e.g., also see FIG. 3A), and includes multiple portions similar to the portion 100 which are distributed along the X-Y plane.

However, in contrast to the conventional vent 82 of FIG. 3A, the portion 100 of the panel member 30 defines a brimmed hole 32 (also see FIGS. 1 and 2) with a zero-degree flare. Specifically, the face portion 62 of the panel member 30 extends in the X-Y plane, and the sides 102 of the brimmed hole 32 extend orthogonally to the X-Y plane, i.e., along the Z-axis, to provide a reliable ventilation pathway.

As mentioned above in connection with FIG. 2, the brimmed hole 32 is formed by the face portion 62 of the panel member 30 which defines an opening 68, and by a brimmed portion 64 which (i) couples to the face portion 62,(ii) borders that opening 68 and (iii) extends from the X-Y plane in a direction that is away from the opening 68 (e.g., the negative Z-direction). Accordingly, the depth 104 of the portion 100 around the brimmed hole 32 along the Z-axis (e.g., 0.144 inches) is greater than the depth 106 of the face portion 62 along the Z-axis (e.g., 0.048 inches). As a result, air is capable of passing through the hole 32 along the Z-axis (e.g., see the arrow 108 in the negative Z-direction) and the panel member 30 provides superior EMI shielding vis-a-vis the conventional vent 82 of FIG. 3A. Such improvement in EMI shielding of the panel member 30 over the conventional vent 82 is attributable, at least in part, to the greater thickness of the panel member 30 at the brimmed holes 32. As will now be explained with reference to FIG. 3C, a further improvement can be made by modifying the brimmed holes 32 with zero-degree flares os shown in FIG. 3B into conical-shaped apertures.

Figure 3C:
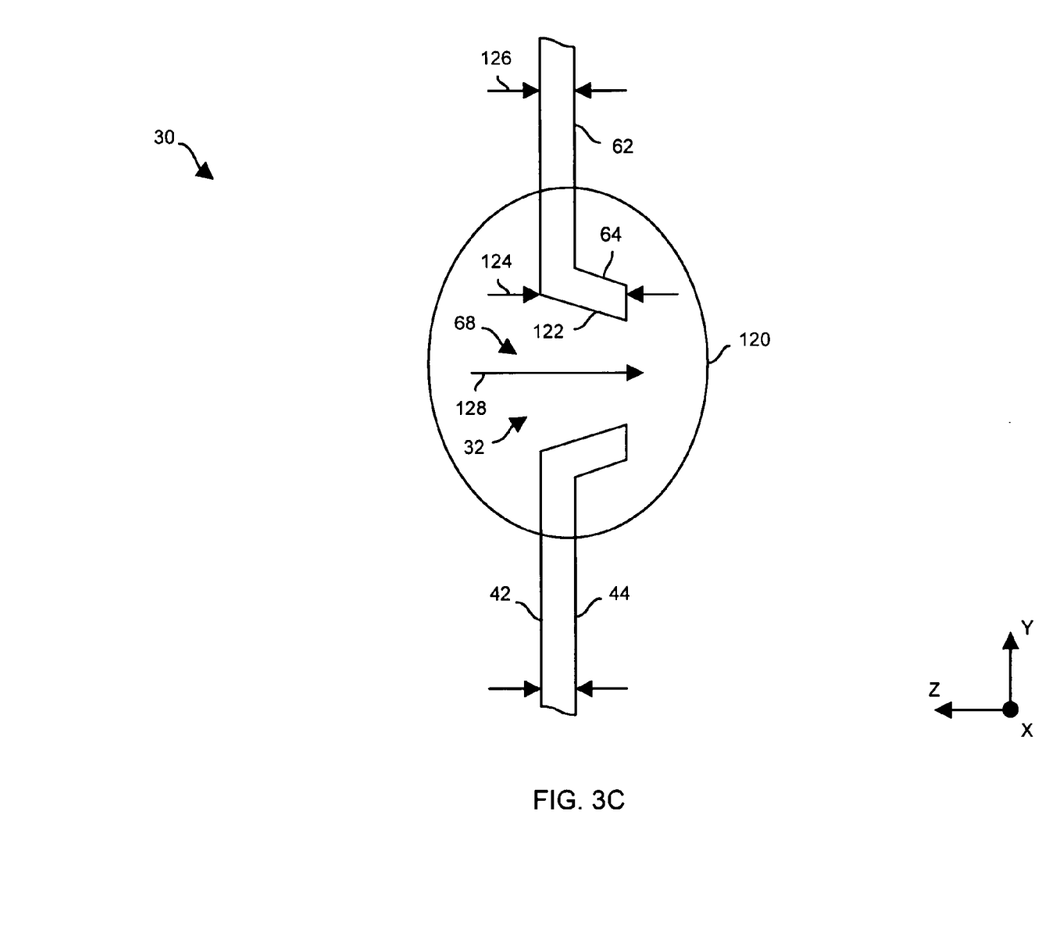
FIG. 3C is a cross-sectional side view of a portion of the panel member of FIG. 2 when the portion has a brimmed hole with a tapered flare.

FIG. 3C is a cross-sectional side view of an alternative panel member portion 120 which is suitable for use as part of a panel member 30 of the electronic system 20 (also see FIGS. 1 and 2). Again, in a manner similar to the conventional vent 82 of FIG. 3A, the panel member 30 extends in the X-Y plane, and includes multiple portions similar to the portion 120 which are distributed along the X-Y plane.

However, in contrast to the conventional vent 82 of FIG. 3A, the portion 120 of the panel member 30 defines a brimmed hole 32 (also see FIGS. 1 and 2) with a tapered flare. In particular, the face portion 62 of the panel member 30 extends in the X-Y plane, and the tapered sides 122 of the brimmed hole 32 extend in a conical manner relative to the X-Y plane to provide a reliable ventilation pathway.

As mentioned above in connection with FIG. 2, the brimmed hole 32 is formed by the face portion 62 of the panel member 30 which defines an opening 68, and by a brimmed portion 64 which (i) couples to the face portion 62, (ii) borders that opening 68 and (iii) extends at a non-perpendicular angle away from the X-Y plane. Accordingly, the depth 124 of the portion 120 around the brimmed hole 32 along the Z-axis (e.g., 0.144 inches) is greater than the depth 126 of the face portion 62 along the Z-axis (e.g., 0.048 inches). As a result, air is capable of passing through the hole 32 along the Z-axis (e.g., see the arrow 128 in the negative Z-direction) and the panel member 30 provides superior EMI shielding vis-a-vis the conventional vent 82 of FIG. 3A. Such improvement in EMI shielding of the panel member 30 over the conventional vent 82 is attributable, at least in part, to the greater thickness of the panel member 30 at the brimmed holes 32. Further details of the alternative portion 120 will now be provided with reference to FIG. 4.

Figure 4:
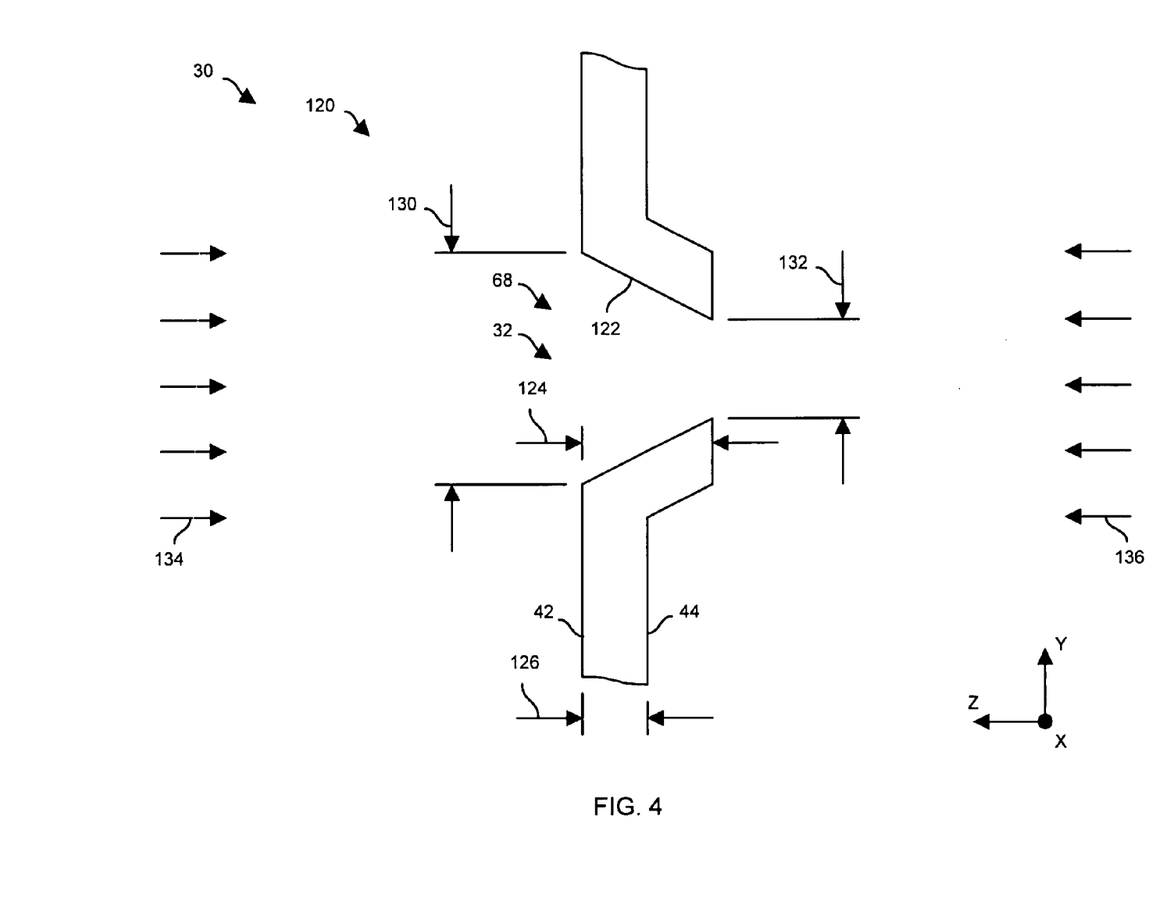
FIG. 4 is a detailed cross-sectional side view of the portion of FIG. 3C.

FIG. 4 is a detailed cross-sectional side view of the portion 120 of the panel member 30 of FIG. 3C. As shown, the panel member 30 defines a diameter 130 for the brimmed hole 32 on the face 42, and another diameter 132 for the brimmed hole 32 on the face 44. The diameter 130 is substantially larger (e.g., 0.166 inches) than the diameter 132 (e.g., 0.140 inches).

In connection with EMI containment, a panel member 30 having the tapering sides 122 provides enhanced EMI shielding beyond the conventional vent 82 of FIG. 3A and beyond a panel member 30 defining the brimmed holes 32 of FIG. 3B. In some arrangements, a panel member 30 defining the brimmed holes 32 of FIGS. 3C and 4 provides EMI shielding levels in the 1 to 40 GHz range for robust EMI containment.

Due to the conical-shaped apertures 122 formed by the decreasing diameters 130, 132 of the brimmed holes 32, the panel member 30 provides different effects depending on the direction of airflow. In particular, airflow 134 toward the face 42 of the panel member 30 (i.e., the negative Z-direction) causes a contraction effect (see FIG. 4). That is, the air compresses as it reaches the face 42 and flows through the brimmed holes 32 to the opposite side of the panel member 30 which is adjacent the face 44. With reference back to FIG. 1, both panel members 30(1), 30(2) are in contraction orientations since the airflow 48 is in the direction of the face 42 of each panel member 30(1), 30(2) (i.e., the negative Z-direction).

In contrast, airflow 136 toward the face 44 in the opposite direction (i.e., the positive Z-direction) of a panel member 30 causes an expansion effect (see FIG. 4). That is, the air expands as it passes through the brimmed holes 32 to the opposite side of the panel member 30 which is adjacent the face 42. With reference back to FIG. 1, both panel members 30(1), 30(2) would be in expansion orientations if the airflow 48 was in the opposite direction (i.e., the positive Z-direction) and toward the face 44 of each panel member 30(1), 30(2).

Table 1 provides a side-by-side comparison of experimental results which were collected by running an actual test assembly laid out in the manner shown for the electronic system 20 of FIG. 1. For comparison purposes, the panel members 30 (implemented as 4.75 inch by 4.75 inch panels) were positioned in different orientations (e.g., contraction orientation versus expansion orientation) within the test assembly and, in some data collection cases, a panel member 30 was replaced with a conventional vent 82 (also see FIG. 3A). Sensors were positioned at various locations to collect the experimental data. In particular, an airflow sensor measured the relative amount of airflow through the internal space 34, a pressure sensor measured the relative amount of stagnation pressure at the internal space 34, a current meter measured the amount of current through the fan subsystem 28, and a volt meter measured the voltage across terminals of the fan subsystem 28.

TABLE 1

| Panel Member Orientation at the Inlet Location | Panel Member Orientation at the Outlet Location | Measured Relative Airflow through the Internal Space | Measured Relative Stagnation Pressure through the Internal Space | Fan Current (Amps) | Fan Voltage (Volts) |
|---|---|---|---|---|---|
| Straight | Straight | 62.1 | 0.51 | 0.42 | 46 |
| Expansion | Contraction | 67.7 | 0.51 | 0.42 | 46 |
| Contraction | Expansion | 65.5 | 0.54 | 0.42 | 46 |
| Straight | Contraction | 68.7 | 0.52 | 0.42 | 46 |
| Straight | Expansion | 60.9 | 0.51 | 0.42 | 46 |
| Expansion | Expansion | 60.9 | 0.50 | 0.42 | 46 |
| Expansion | Straight | 62.1 | 0.50 | 0.42 | 46 |
| Contraction | Contraction | 75.8 | 0.55 | 0.42 | 46 |
| Contraction | Straight | 66.6 | 0.54 | 0.42 | 46 |

As shown in Table 1, the best results were obtained when both panel members 30(1), 30(2) were orientated in contraction effect positions, i.e., such that their faces 42 faced the airflow and the their faces 44 faced away from the airflow. This is the configuration illustrated in FIG. 1. That is, this configuration provides optimal fluid dynamics efficiency from the perspective of airflow and stagnation pressure without significantly affecting the power requirements of the fan subsystem 28.

Other conclusions are capable of being made from the results shown in Table 1 as well. For example, the substantially constant current and voltage results indicate that venting style has little or no impact on power consumption by the fan subsystem 28. Additionally, the results of the airflow and stagnation pressure measurements are tightly correlated thus indicating that the increase in stagnation pressure reflects the improved ability of overcoming higher airflow resistance encountered when working with higher density printed circuit boards. Furthermore, the collected data clearly indicates that expansion orientations for the panel members 30 results in disadvantageous airflow and stagnation pressure (e.g., a 5% degradation over cooling dynamics provided by using only conventional vents). Moreover, the collected data clearly indicates that contraction-to-contraction style venting (i.e., the use of a contraction oriented panel member 30 at the input location 40 and a second contraction oriented panel member 30 at the output location 46) provided the most favorable performance (e.g., a 24% improvement in airflow and a 10% improvement in stagnation pressure). Further details of the invention will now be provided with reference to FIGS. 5A and 5B.

Figure 5A:
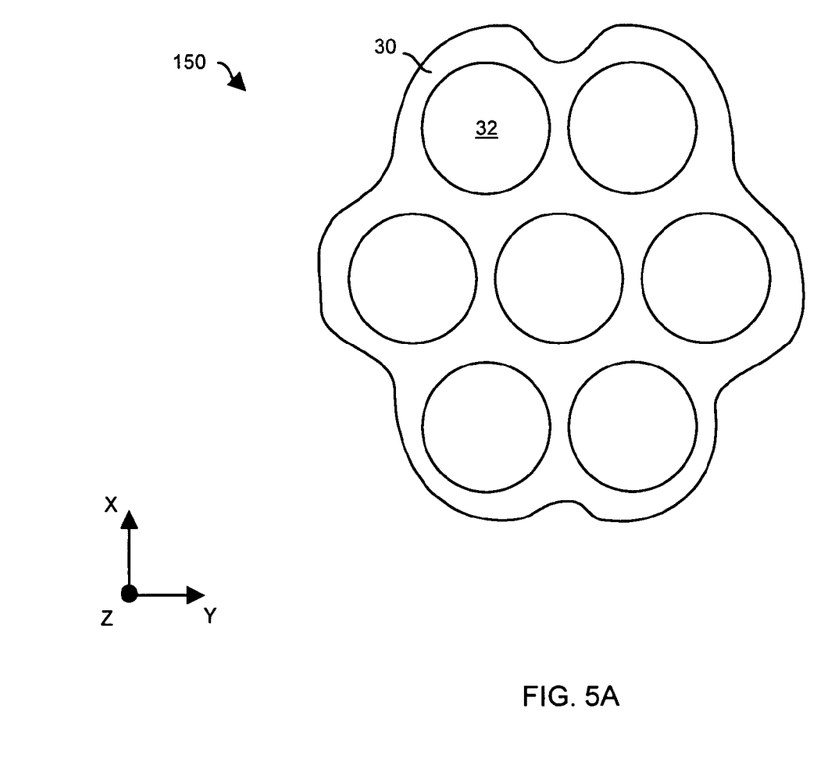
FIG. 5A is a front view of a panel member of the electronic system of FIG. 1 when the brimmed holes of the panel member have a honey-comb configuration.

FIG. 5A is a front view of a hole pattern 150 of a panel member 30 of the electronic system 20 of FIG. 1 when the brimmed holes 32 of the panel member 30 have a honey-comb configuration. By way of example, the hole diameter is 0.140 inches, the hole pitch is 0.170 inches, the web thickness is 0.030 inches, and the material thickness is 0.048 inches.

Although this honey-comb configuration provides maximum airflow, the geometry of the panel member 30 makes it difficult to achieve robust EMI shielding. Nevertheless, the hole pattern 150 is capable of being used for the panel member 30 in certain situations (e.g., when EMI requirements are less demanding).

Figure 5B:
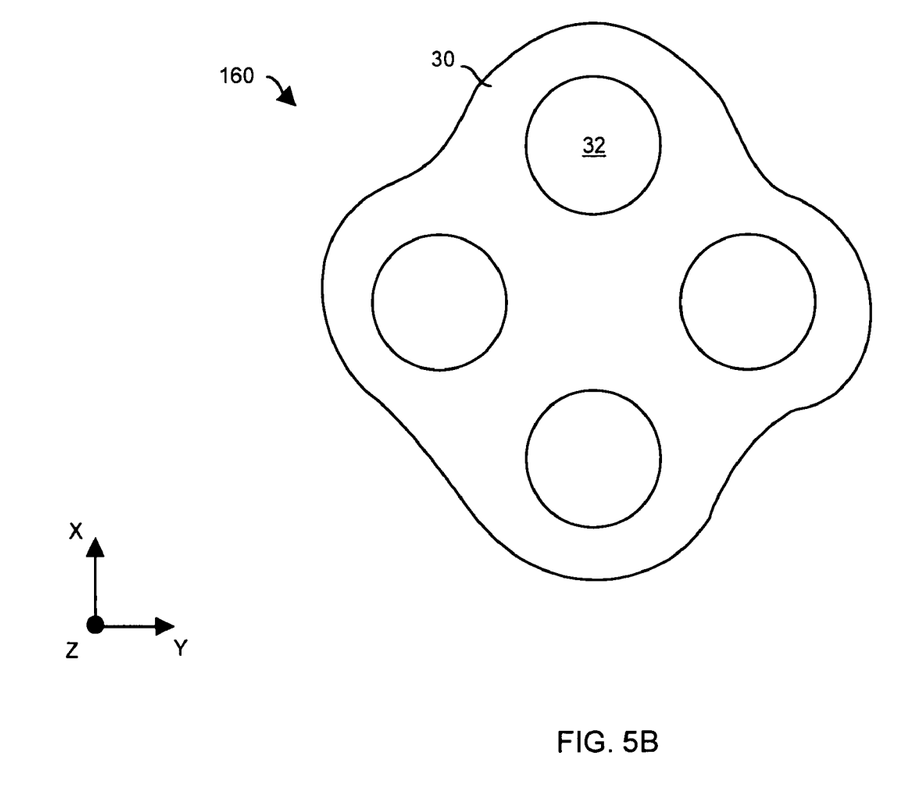
FIG. 5B is a front view of a panel member of the electronic system of FIG. 1 when the brimmed holes of the panel member have a diagonalized configuration.

FIG. 5B is a front view of an alternative hole pattern 160 of a panel member 30 when the brimmed holes 32 of the panel member 30 have a diagonalized configuration. By way of example, the hole diameter is (i) 0.140 inches if arranged as shown in FIG. 3B or (ii) 0.140 inches flared to 0.160 inches if arranged as shown in FIG. 3C. The hole pitch is 0.255 inches, the web thickness is 0.115 inches, and the material thickness is 0.048 inches.

The hole pattern 160 provides superior EMI shielding characteristics compared to that of the honey-comb configuration of FIG. 5A. In particular, the hole pattern 160 provides acceptable EMI containment with the brimmed holes 32 of FIG. 3B. Furthermore, the hole pattern 160 provides optimal EMI shielding with the alternative brimmed holes 32 of FIG. 3C along with substantially improved airflow dynamics. Accordingly, the hole placement in the pattern 160 of FIG. 5B is superior to the hole placement in the pattern 150 of FIG. 5A from an EMI shielding perspective.

As mentioned above, embodiments of the invention are directed to techniques for venting electronic circuitry 22 using panel members 30 having brimmed holes 32, i.e., edges 64 which project around the holes 32 and in a direction which is away from a plane of the panel member 30. The use of panel members 30 having such brimmed holes 32 as shown in FIGS. 3C and 4 enables production of contraction effects resulting in improved airflow and stagnation pressure, with maintained or improved EMI shielding. Experimental results have shown that the use of panel members 30 with such brimmed holes 32 is capable of providing significant enhancements in airflow (e.g., a 24% increase) and significant enhancements in stagnation pressure (e.g., a 10% increase) for robust and reliable thermal control simultaneously with robust EMI shielding results.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A support assembly for supporting electronic circuitry, the electronic assembly comprising:
   a frame configured to hold the electronic circuitry;
   a fan subsystem coupled to the frame; and
   a panel member attached to the frame, the panel member is disposed at an input location of the frame, and the panel member including:
      a mounting portion configured to mount to the frame;
      a face portion coupled to the mounting portion, the face portion defining a plane and multiple openings within the plane, the face portion has a first depth which is measured in a direction that is perpendicular to the plane; and
      multiple brimmed portions coupled to the face portion, each brimmed portion (i) extending around an opening defined by the face portion and (ii) projecting from that opening in a direction which is away from the plane, the face portion and multiple brimmed portions forming ventilation pathways for an air stream provided by the fan subsystem in order to cool the electronic circuitry wherein the face portion in combination with any of the multiple brimmed portions forms a projecting edge having a second depth which is measured in the direction that is perpendicular to the plane, and wherein the second depth is substantially greater than the first depth to provide enhanced electromagnetic interference shielding characteristics to the panel member and the face portion in combination with the multiple brimmed portions defines a set of tapered holes as the ventilation pathways, and wherein the face portion in combination with the multiple brimmed portions defines a set of conical shaped apertures as the set of tapered holes with larger diameters facing away from the electronic circuitry and smaller diameters facing the electronic circuitry.

2. The support assembly of claim 1 wherein the mounting portion, the face portion and the multiple pathway portion are integral with each other to form a single, contiguous component having (i) a non-metallic internal core, and (ii) a metallic outer layer to provide the enhanced electromagnetic interference shielding characteristics.

3. A support assembly for supporting electronic circuitry, the electronic assembly comprising:
   a frame configured to hold the electronic circuitry;
   a fan subsystem coupled to the frame; and
   a panel member attached to the frame, the panel member disposed at an output location of the frame;
   another panel member, the other panel member disposed at an input location of the frame, the panel member including:
      a mounting portion configured to mount to the frame;
      a face portion coupled to the mounting portion, the face portion defining a plane and multiple openings within the plane, the face portion has a first depth which is measured in a direction that is perpendicular to the plane; and
      multiple brimmed portions coupled to the face portion, each brimmed portion (i) extending around an opening defined by the face portion and (ii) projecting from that opening in a direction which is away from the plane, the face portion and multiple brimmed portions forming ventilation pathways for an air stream provided by the fan subsystem in order to cool the electronic circuitry wherein the face portion in combination with any of the multiple brimmed portions forms a projecting edge having a second depth which is measured in the direction that is perpendicular to the plane, and wherein the second depth is substantially greater than the first depth to provide enhanced electromagnetic interference shielding characteristics to the panel member and the face portion in combination with the multiple brimmed portions defines a set of conical-shaped apertures as the ventilation pathways, and wherein the panel member having a face portion in combination with the multiple brimmed portions defines the set of conical-shaped apertures with larger diameters facing the electronic circuitry and smaller diameters facing away from the electronic circuitry, and the other panel member having a face portion in combination with multiple brimmed portions defining a set of conical shaped apertures with larger diameters facing away from the electronic circuitry and smaller diameters facing the electronic circuitry.

4. An electronic system, comprising:
electronic circuitry; and
a support assembly which supports the electronic circuitry, the support assembly including:
   a frame configured to hold the electronic circuitry at a central location of the frame,
   a fan subsystem disposed at the central location of the frame,
   a first panel member disposed at an input location of the frame, and
   a second panel member disposed at an output location of the frame, each panel member including:
      a mounting portion configured to mount to the frame,
      a face portion coupled to the mounting portion, the face portion defining a plane and multiple openings within the plane, and
      multiple brimmed portions coupled to the face portion, each brimmed portion (i) extending around an opening defined by the face portion and (ii) projecting from that opening in a direction which is away from the plane, wherein,
      for each panel member, (i) the face portion has a first depth which is measured in a direction that is perpendicular to the plane, (ii) the face portion in combination with any of the multiple brimmed portions forms a projecting edge having a second depth which is measured in the direction that is perpendicular to the plane, and (iii) the second depth is substantially greater than the first depth to provide enhanced electromagnetic interference shielding characteristics to the panel member;
      for each panel member, the face portion in combination with the multiple brimmed portions defines a set of conical shaped apertures as the ventilation pathways;
      the face portion of the first panel member in combination with the multiple brimmed portions defines the set of conical shaped apertures with larger diameters facing away from the electronic circuitry and smaller diameters facing the electronic circuitry; and
      the face portion of the second panel member in combination with the multiple brimmed portions defines the set of conical shaped apertures with larger diameters facing the electronic circuitry and smaller diameters facing away from the electronic circuitry.

5. An electronic system of claim 4 wherein the set of conical shaped apertures are in a hole pattern of a honeycomb configuration.

6. An electronic system of claim 5 wherein the conical shaped apertures have a diameter of 0.140 inches on the smaller diameter of the aperture and the spacing of the apertures is at a spacing pitch of 0.170 inches.

7. An electronic system of claim 4 wherein the set of conical shaped apertures are in a hole pattern of a diagonalized configuration wherein the conical shaped apertures have a diameter of 0.140 inches on the smaller diameter of the aperture and the spacing of the apertures is at a spacing pitch of 0.255 inches.

8. A support assembly for supporting electronic circuitry, the electronic assembly comprising:
   a frame configured to hold the electronic circuitry;
   a fan subsystem coupled to the frame; and
   a panel member attached to the frame, the panel member including:
      a mounting portion configured to mount to the frame;
      a face portion coupled to the mounting portion, the face portion defining a plane and multiple openings within the plane, the face portion has a first depth which is measured in a direction that is perpendicular to the plane; and
      multiple brimmed portions coupled to the face portion, each brimmed portion (i) extending around an opening defined by the face portion and (ii) projecting from that opening in a direction which is away from the plane, the face portion and multiple brimmed portions forming ventilation pathways for an air stream provided by the fan subsystem in order to cool the electronic circuitry wherein the face portion in combination with any of the multiple brimmed portions forms a projecting edge having a second depth which is measured in the direction that is perpendicular to the plane, and wherein the second depth is substantially greater than the first depth to provide enhanced electromagnetic interference shielding characteristics to the panel member and the face portion in combination with the multiple brimmed portions defines a set of tapered holes as the ventilation pathways,
   another panel wherein the face portion in combination with the multiple brimmed portions defines a set of conical shaped apertures as the set of tapered holes;
   the panel member is disposed at an output location of the frame, and wherein the face portion in combination with the multiple brimmed portions defines the set of conical shaped apertures with larger diameters facing the electronic circuitry and smaller diameters facing away from the electronic circuitry;
   the other panel member is disposed at an input location of the frame, the other panel member having a face portion in combination with multiple brimmed portions defining a set of conical shaped apertures with larger diameters facing away from the electronic circuitry and smaller diameters facing the electronic circuitry; and
   the conical shaped apertures have a diameter of 0.140 inches on the smaller diameter of the aperture.

9. A support assembly of claim 8 wherein the set of conical shaped apertures are in a hole pattern of a honeycomb configuration.

10. An electronic system, comprising:
electronic circuitry; and
a support assembly which supports the electronic circuitry, the support assembly including:
   a frame configured to hold the electronic circuitry at a central location of the frame,
   a fan subsystem disposed at the central location of the frame,
   a first panel member disposed at an input location of the frame, and
   a second panel member disposed at an output location of the frame, each panel member including:
      a mounting portion configured to mount to the frame,
      a face portion coupled to the mounting portion, the face portion defining a plane and multiple openings within the plane, and multiple brimmed portions coupled to the face portion, each brimmed portion (i) extending around an opening defined by the face portion and (ii) projecting from that opening in a direction which is away from the plane, wherein, for each panel member, (i) the face portion has a depth which is measured in a direction that is perpendicular to the plane, (ii) the face portion in combination with any of the multiple brimmed portions forms a projecting edge having a second depth which is measured in the direction that is perpendicular to the plane, and (iii) the second depth is substantially greater than the first depth to provide enhanced electromagnetic interference shielding characteristics to the panel member;

the face portion in combination with the multiple brimmed portions defines a set of conical shaped apertures as the ventilation pathways, the face portion of the first panel member in combination with the multiple brimmed portions defines the set of conical shaped apertures with larger diameters facing away from the electronic circuitry and smaller diameters facing the electronic circuitry;

the face portion of the second panel member in combination with the multiple brimmed portions defines the set of conical shaped apertures with larger diameters facing the electronic circuitry and smaller diameters facing away from the electronic circuitry; and the set of conical shaped apertures on both the first panel and the second panel are in a hole pattern of a diagonalized configuration wherein the conical shaped apertures have a diameter of 0.140 inches on the smaller diameter of the apertures and the spacing of the apertures is at a spacing pitch of 0.255 inches.

\* \* \* \* \*